United States Patent
Kim

(10) Patent No.: US 7,667,291 B2
(45) Date of Patent: Feb. 23, 2010

(54) FPGA STRUCTURE PROVIDED WITH MULTI PARALLEL STRUCTURE AND METHOD FOR FORMING THE SAME

(75) Inventor: Kee Yong Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 301 days.

(21) Appl. No.: 11/645,656

(22) Filed: Dec. 27, 2006

(65) Prior Publication Data

US 2007/0145524 A1    Jun. 28, 2007

(30) Foreign Application Priority Data

Dec. 28, 2005   (KR) .................. 10-2005-0132425

(51) Int. Cl.
*H01L 21/00* (2006.01)
(52) U.S. Cl. .................. 257/530; 257/295; 257/296
(58) Field of Classification Search .................. 257/530, 257/295–296
See application file for complete search history.

(56) References Cited

U.S. PATENT DOCUMENTS

| | | | | |
|---|---|---|---|---|
| 5,329,153 A | * | 7/1994 | Dixit | 257/530 |
| 5,789,320 A | * | 8/1998 | Andricacos et al. | 438/678 |
| 5,990,507 A | * | 11/1999 | Mochizuki et al. | 257/295 |
| 6,027,861 A | * | 2/2000 | Yu et al. | 430/316 |
| 6,465,282 B1 | * | 10/2002 | Tobben et al. | 438/131 |
| 6,515,509 B1 | * | 2/2003 | Baxter | 326/39 |
| 6,730,573 B1 | * | 5/2004 | Ng et al. | 438/381 |
| 6,737,686 B2 | * | 5/2004 | Fricke et al. | 257/209 |
| 6,881,994 B2 | * | 4/2005 | Lee et al. | 257/296 |
| 6,992,349 B2 | * | 1/2006 | Lee et al. | 257/324 |
| 7,302,157 B2 | * | 11/2007 | Chui | 385/147 |
| 2002/0050625 A1 | * | 5/2002 | Cutter et al. | 257/530 |
| 2004/0087098 A1 | * | 5/2004 | Ng et al. | 438/381 |
| 2007/0145524 A1 | * | 6/2007 | Kim | 257/530 |

* cited by examiner

*Primary Examiner*—Laura M Menz
(74) *Attorney, Agent, or Firm*—Lowe Hauptman Ham & Berner, LLP

(57) ABSTRACT

In an FPGA of a semiconductor device and a method of forming the FPGA, a first pattern having a voltage selectable conductivity is formed to connect first vias of the semiconductor device in parallel.

4 Claims, 5 Drawing Sheets

FPGA STRUCTURE PROVIDED WITH MULTI PARALLEL STRUCTURE AND METHOD FOR FORMING THE SAME

TECHNICAL FIELD

The disclosure relates to a semiconductor manufacturing technology; and, more particularly, to a multi-parallel-structured field programmable gate array (FPGA) and a method for forming the same.

BACKGROUND

Generally, during the formation of a multi layer metal wiring, a technology of a via is used for connecting a bottom metal wiring to a top metal wiring.

FIG. 1 is a diagram showing a method for forming a field programmable gate array (FPGA) according to a prior art.

Referring to FIG. 1, after a first metal wiring M1 is formed, a first inter metal dielectric (IMD) 11 is deposited and the first IMD 11 is planarized through a chemical mechanical polishing (CMP).

Thereafter, after a first via hole to expose a surface of the first metal wiring M1 is formed by etching the first IMD 11 by using a via mask, a first via 12 filled inside of the first via hole is formed through a tungsten deposition and the CMP.

And then, a second metal wiring M2 connected to the first metal wiring M1 through the first via 12 is formed on the first via 12.

In the next step, a second IMD 13 is deposited on the second metal wiring M2; a second via hole and a second via 14 filled into the second via hole are formed; and a third metal wiring M3 connected to the second via 14 is formed.

Thereafter, a third IMD 15 is deposited on the third metal wiring M3, and a third via hole and a third via 16 which fills the third via hole are formed, and a fourth metal wiring M4 connected to the third via 16 is formed.

However, the above-mentioned multi-layer metal wiring manufacturing process, as shown in FIG. 1, has a problem that a manufacturing cost of a semiconductor device is excessively spent since an unnecessary process and masks, e.g., the number of via masks required is smaller than that of metal wiring masks by one, are used.

SUMMARY

Therefore, there is a need to provide an FPGA structure of a semiconductor device capable of reducing a manufacturing cost by using a simpler manufacturing process and a method for manufacturing the same.

In an aspect, a field programmable gate array (FPGA) structure of a semiconductor device comprising first and second metal wiring layers stacked one upon another with an inter-metal dielectric layer (IMD) interposed therebetween is provided. The FPGA structure comprises a pair of first vias connecting a pair of first metal wiring portions in the first metal wiring layer to a pair of corresponding second metal wiring portions in the second metal wiring layer, respectively; and a first pattern having a voltage selectable conductivity and connecting the first vias.

In a further aspect, a method of forming a field programmable gate array (FPGA) of a semiconductor device includes the step of forming a first pattern having a voltage selectable conductivity to connect first vias of the semiconductor device in parallel.

In accordance with an embodiment of the present invention, there is provided a field programmable gate array (FPGA) structure of a semiconductor device provided with a structure in which a first metal wiring group, a second metal wiring group, a third metal wiring group and a fourth metal wiring are sequentially stacked with inserting a plurality of inter-metal dielectrics (IMDs) therebetween, the FPGA structure including: a pair of first vias for connecting a pair of first metal wirings in the first metal wiring group to a pair of corresponding second metal wirings in the second metal wiring group; a first construction material pattern of a voltage selectable conduction for connecting the pair of first vias; a pair of second vias for connecting another pair of second metal wirings in the second metal wiring group to a pair of corresponding third metal wirings in the second metal wiring group; a second construction material pattern of a voltage selectable conduction for connecting the pair of the second vias; and a third via for connecting each of the first construction material pattern and the second construction material pattern to the fourth metal wiring, respectively.

In accordance with another embodiment of the present invention, there is provided a method for forming a field programmable gate array (FPGA) of a semiconductor device, the method includes the steps of: forming a first via parallel connection material provided with a structure in which neighboring first vias are connected in parallel by a first amorphous silicon pattern; forming a second via parallel connection material provided with a structure in which neighboring second vias are connected in parallel by a second amorphous silicon pattern at a position where the first via parallel connection material is not overlapped; and forming a connection material for connecting the first via parallel connection material to the second via parallel connection material.

In accordance with still another embodiment of the present invention, there is provided a field programmable gate array (FPGA) structure of a semiconductor device provided with a structure in which a first metal wiring group and a second metal wiring group are sequentially stacked with placing an inter-metal dielectric (IMD) therebetween, the FPGA structure includes: a pair of vias for connecting a pair of first metal wiring in the first metal wiring group to a pair of corresponding second metal wiring in the second metal wiring group; and a construction material pattern of a voltage selectable conduction for connecting the pair of the vias.

In accordance with still another embodiment of the present invention, there is provided a field programmable gate array (FPGA) structure of a semiconductor device provided with a structure in which a first metal wiring group, a second metal wiring group and a third metal wiring are sequentially stacked with placing a plurality of inter-metal dielectrics (IMDs) therebetween, the FPGA structure including: a pair of first vias for connecting a pair of first metal wiring in the first metal wiring group to a pair of corresponding second metal wirings in the second metal wiring group; a construction material pattern of a voltage selectable conduction for connecting the pair of the first vias; a voltage selectable conductive pattern formed on another second metal wiring which is not included in the pair of the second metal wirings; and a pair of second vias for connecting the construction material pattern and the conductive pattern to the third metal wiring, respectively.

In accordance with still another embodiment of the present invention, there is provided a field programmable gate array (FPGA) structure of a semiconductor device provided with a structure in which a first metal wiring group, a second metal wiring group and a third metal wiring are sequentially stacked with placing a plurality of inter-metal dielectrics (IMDs) therebetween, the FPGA structure including: a pair of first vias for connecting a pair of first metal wirings in the first metal wiring group to a pair of corresponding second metal wirings in the second metal wiring group; a construction material pattern of a voltage selectable conduction for connection the pair of the first vias; a second via for connecting the construction material pattern and another second metal wiring not included in the pair of the second metal wirings to the third metal wiring; and a voltage selectable conductive pattern formed between an upper portion of the second via connected to the another second metal wiring and the third metal wiring.

BRIEF DESCRIPTION OF THE DRAWINGS

The above and other objects and features of the present invention will become apparent from the following description of several embodiments given in conjunction with the accompanying drawings, in which.

DETAILED DESCRIPTION OF EMBODIMENTS

Hereinafter, several embodiments of the present invention will be described in detail with reference to the accompanying drawings so that they can be readily implemented by those skilled in the art.

Following embodiments propose a structure capable of using two metals at once by connecting metals through an effective method in a metal wiring process as a wiring process technology of a field programmable gate array (FPGA) in comparison with a prior art and a method for manufacturing the same.

Further, by effectively connecting a top metal structure to a bottom metal structure, the use of a mask can be reduced, thereby reducing a manufacturing cost and decreasing a cycle time.

And, a technology capable of having an effect that a membrane is changed into a conductive state, i.e., a voltage selectable conductivity, above a predetermined voltage in the FPGA for a technology using the amorphous silicon as it is connected through a via or a metal wiring. The FPGA technology defines many gate arrays so that an end-user can use a needed gate for a chip function.

Embodiment 1

FIG. 2A to FIG. 2E are process flow diagrams showing a process for forming an FPGA on a substrate in accordance with a first embodiment of the present invention.

Figure 1:
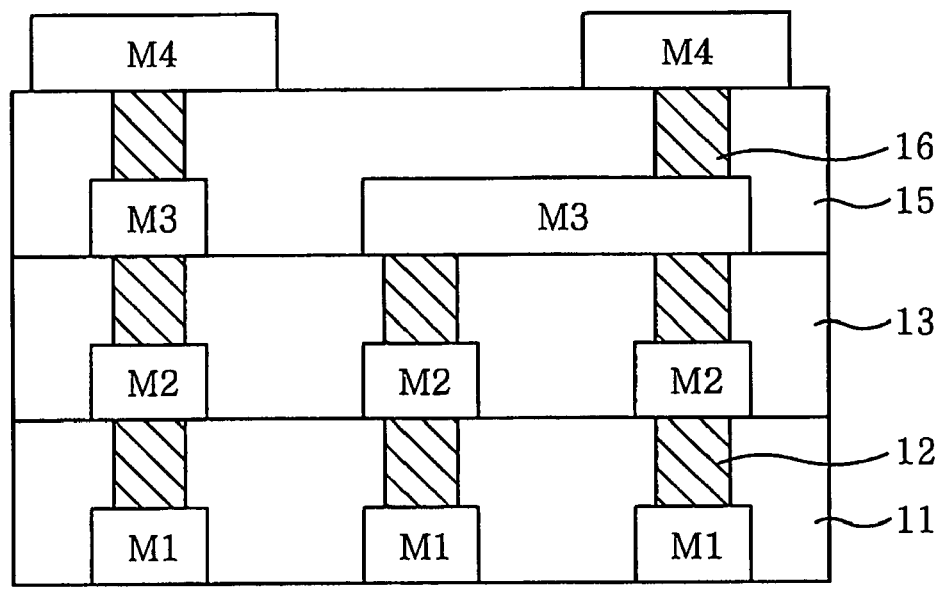
FIG. 1 is a cross-sectional diagram showing a structure of an FPGA according to a prior art.
Figure 2A:
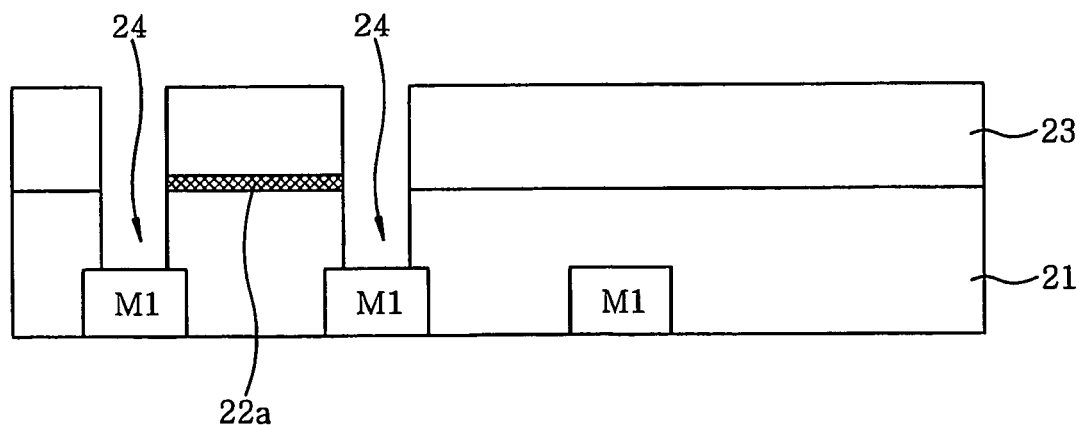
FIG. 2A to FIG. 2E are process flow diagrams illustrating a process of forming an FPGA on a substrate in accordance with a first embodiment of the present invention.

Referring to FIG. 2A, after forming a first metal wiring M1, i.e., a first metal wiring group including n number of first metal wirings, is formed on a substrate which is not shown, a first inter-metal dielectric (IMD) 21 is deposited by performing a deposition process and, thereafter, the first IMD 21 is planarized by performing an IMD CMP.

Thereafter, after first amorphous silicon is deposited on the planarized first IMD 21 by performing a deposition process, a first amorphous silicon pattern 22a is formed by performing a patterning process. Herein, both sides of the formed first amorphous silicon pattern 22a are come in touch with at least a via hole which is formed on a neighboring first metal wiring M1 through a following process. Further, the first amorphous silicon pattern 22a becomes a thickness capable of being operated at an appropriate voltage. In addition, the first amorphous silicon can be deposited by using a low pressure chemical vapor deposition (LPCVD) or an atmosphere pressure CVD (APCVD).

Next, after a second IMD 23 is deposited on the first IMD 21 where the first amorphous silicon pattern 22a is formed at a target position by performing a deposition process, an upper portion of the second IMD 23 is planarized by performing the IMD CMP.

Thereafter, portions of the second IMD 23 and the first IMD 21 on the first metal wiring M1 are selectively removed by performing a selective etching process using an etching mask which is not shown so that a first via hole 24 is formed through a 'Via1 process' to expose a surface of a neighboring arbitrary first metal wiring M1 among the first metal wiring M1. Herein, when the first via hole 24 is formed, an etching process is performed with placing the first amorphous silicon pattern 22a therebetween and both side surfaces of the first amorphous silicon pattern 22a are exposed to an inside of the first via hole 24.

Figure 2B:
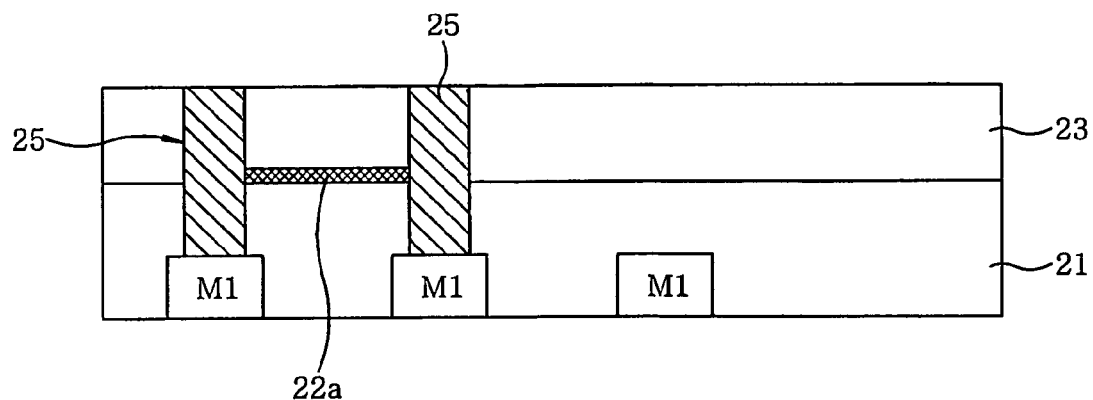

Again, a thick film of metal material is formed on a whole surface in a shape of completely burying (gap filling) the first via hole 24 and a first via 25 filling the first via hole 24 with a metal material is formed by performing a whole planarization etching process such as the CMP, as shown in FIG. 2B as one example.

Herein, the first amorphous silicon pattern 22a is connected to a neighboring arbitrary first metal wiring M1, i.e., a second metal wiring group including n number of second metal wiring, through the first via 25 and, thus, the first amorphous silicon pattern 22a connects neighboring first via 25 in parallel. The above-mentioned structure is called as a 'first via parallel structure'.

Figure 2C:
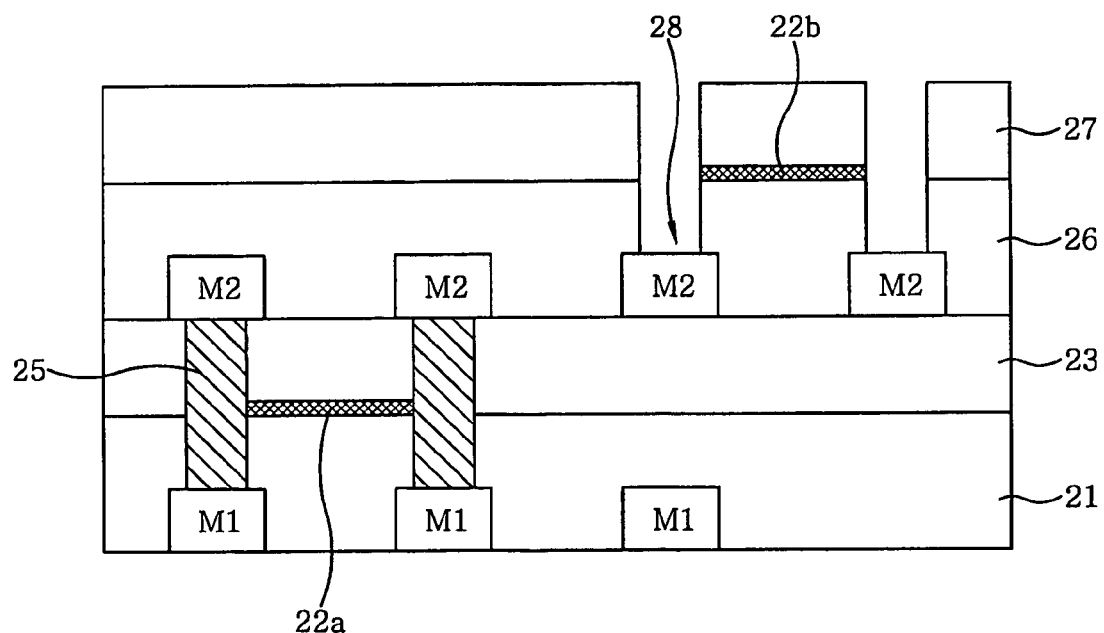
Figure 2D:
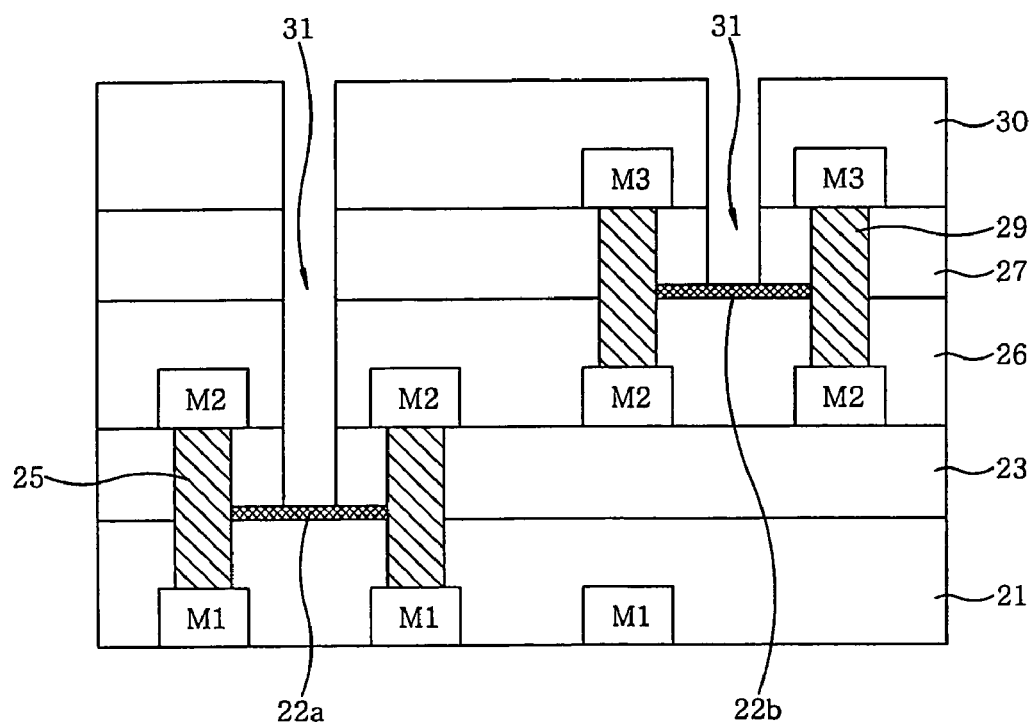
Figure 2E:
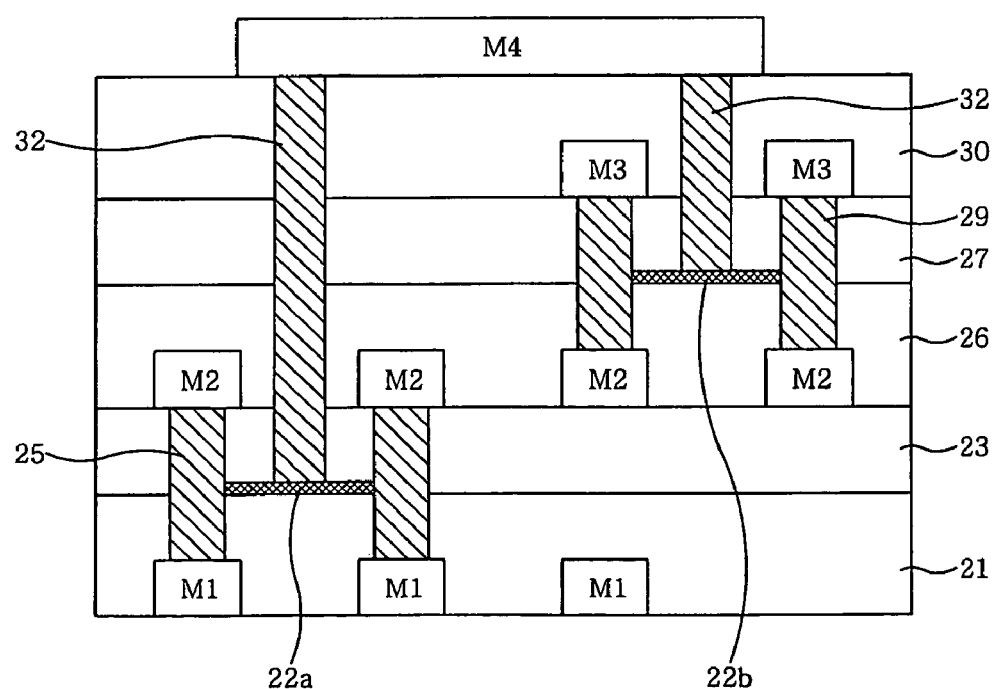

Next, referring to FIG. 2C, after a second metal wiring M2 connected to the first via 25 is formed, a thick film of third IMD 26 is deposited until the third IMD 26 completely buries the second metal wirings M2 and an upper portion of the third IMD 26 is planarized by performing the CMP.

Again, after second amorphous silicon is deposited on the planarized third IMD 26 by performing a deposition process, a second amorphous silicon pattern 22b is formed by performing a patterning process. Herein, the both side ends of the formed second amorphous silicon pattern 22b are come in touch with at least a via hole which is formed on a neighboring second metal wiring M2 through a following process. Further, the second amorphous silicon pattern 22b becomes a thickness capable of being operated at an appropriate voltage. In addition, the second amorphous silicon can be deposited through a process such as the LPCVD, the APCVD or the like.

Furthermore, the second amorphous silicon pattern 22b is formed with a thickness thicker than that of the first amorphous silicon pattern 22a and is formed, in a plane view, on a region except a region where the first amorphous silicon pattern 22a is formed. That is, the first amorphous silicon pattern 22a and the second amorphous silicon pattern and 22b do not overlap with each other.

Next, after a fourth IMD 27 is deposited on the third IMD 26 where the second amorphous silicon pattern 22b is formed at a target position by performing a deposition process, an upper portion of the fourth IMD 27 is planarized by performing the IMD CMP.

Thereafter, portions of the fourth IMD 27 and the third IMD 26 on the second metal wiring M2 are selectively removed by performing a selective etching process using an etching mask which is not shown so that a second via hole 28 is formed through a 'Via2 process' to expose a surface of a neighboring arbitrary second metal wiring M2 among the second metal wiring M2. Herein, when the second via hole 28 is formed, an etching process is performed with placing the second amorphous silicon pattern 22b therebetween and both side surfaces of the second amorphous silicon pattern 22b are exposed to an inside of the second via hole 28.

Again, referring to FIG. 2D, a thick film of metal material is formed on a whole surface in a shape of completely burying the second via hole 28 and a whole planarization etching process such as the CMP is performed so that a second via 29 is formed with burying (gap filling) the second via hole 28 with a metal material.

Herein, the second amorphous silicon pattern 22b is connected to a neighboring arbitrary second metal wiring M2 through the second via 29 and, thus, the second amorphous silicon pattern 22b connects a neighboring second via 29 in parallel. The above-mentioned structure is called as a 'second via parallel structure'.

Thereafter, a third metal wiring M3, i.e., a third metal wiring group including n numbers of third metal wirings, which is connected to the second metal wiring M2 through the second via 29 are formed, and a fifth IMD 30 are deposited and the CMP is performed.

Next, by performing a selective etching process ('Via3' patterning process) using an etching mask which is not shown, portions of the fifth IMD 30 and the fourth IMD 27 on the second amorphous silicon pattern 22b are sequentially removed in order to expose an upper portion of the second amorphous silicon pattern 22b and portions of the fifth, fourth, third and second IMDs 30, 27, 26 and 23 on the first amorphous silicon pattern 22a are sequentially removed in order to expose an upper portion of the first amorphous silicon pattern 22a so that a third via hole 31 is formed.

That is, the third via hole which exposes an upper portion of the first amorphous silicon pattern 22a and the third via hole 31 which exposes an upper part of the second amorphous silicon pattern 22b are opened (exposed) at the same time.

Again, referring to FIG. 2E, after a thick film of metal material such as a tungsten is formed thickly in a shape of completely burying the third via hole 31, a whole surface etching process such as the CMP is performed in order to remove a metal material on the fifth IMD 30 so that a third via 32 is formed with burying the third via hole 31 with a metal material and, thereafter, a fourth metal wiring M4 connected to the third via 32 is formed.

Therefore, the first amorphous silicon pattern 22a is connected to the second amorphous silicon pattern 22b through the third via 32 and the fourth metal wiring M4. As a result, the first via parallel structure formed with the first amorphous silicon pattern 22a and the second via parallel structure formed with the second amorphous silicon pattern 22b are connected in parallel by a voltage of the fourth metal wiring M4 so that the FPGA is embodied. Herein, different voltages are selectively applied to the first amorphous silicon pattern 22a and the second amorphous silicon pattern 22b.

Therefore, in the FPGA structures of the semiconductor devices in accordance with the embodiments of the present invention, by using two amorphous silicons having a different thickness, the first metal wiring, the second metal wiring and the third metal wiring can be selectively used by using a single voltage (the fourth metal wiring voltage).

Embodiment 2

Figure 3:
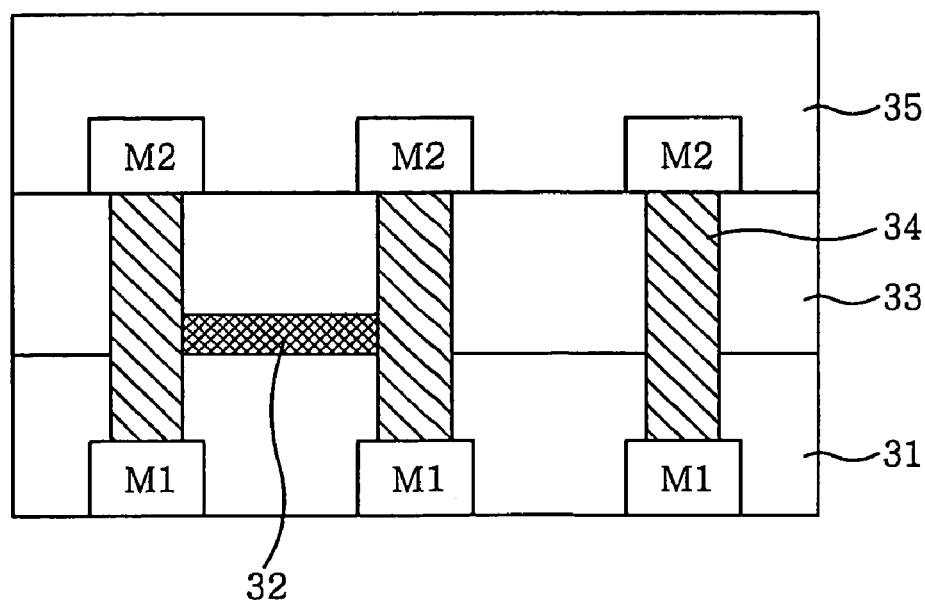
FIG. 3 is a cross-sectional view of a multi layer parallel structured FPGA in accordance with a second embodiment of the present invention.

FIG. 3 is a cross-sectional view of a multi layer parallel structured FPGA in accordance with a second embodiment of the present invention.

Referring to FIG. 3, according to the FPGA structure in accordance with the second embodiment of the present invention, a second IMD 33 is formed on a first IMD 31 which buries a first metal wiring M1 group, and a second metal wiring M2 group is formed on the second IMD 33 at a corresponding position of the first metal wiring M1 group, and a third IMD 35 which buries the second metal wiring M2 group is formed.

Further, each of the first metal wirings M1 included in the first metal wiring M1 group is connected to each corresponding second metal wiring M2 included in the second metal wiring M2 group through a via 34, and at least one pair of neighboring via 34 is connected each other through an amorphous silicon pattern 32. Herein, the amorphous silicon pattern has substantial same function and material with the above-mentioned first amorphous silicon pattern 22a of the first embodiment of the present invention. When a voltage which is equal to or higher than a predetermined voltage level is applied to the amorphous silicon pattern, a character of the amorphous silicon pattern is changed to a conductive state (that is, voltage selective conductivity) so that a connected conductor is operated as a via or a metal wiring.

That is, the FPGA in accordance with the second embodiment of the present invention includes a first metal wiring group layer and a second metal wiring group layer insulated by an insulating layer, i.e., the IMD and two numbers of via which connect one pair of first metal wiring to a corresponding pair of second metal wiring is connected each other by the amorphous silicon pattern. Accordingly, in accordance with the second embodiment of the present invention, a needed gate array can be selectively used by using a voltage of the second metal wiring.

Herein, the FPGA in accordance with the second embodiment of the present invention can be easily embodied by selective combinations of the series of process (for instance, deposition, selective etching and front etching) for manufacturing the FPGA in accordance with the first embodiment of the present invention. Therefore, for avoiding a duplicate description and for a concise description of the specification, a detailed description will be omitted.

Accordingly, although the FPGA in accordance with the second embodiment of the present invention has a little bit different structure in comparison with the FPGA in accordance with the first embodiment of the present invention, the FPGA in accordance with the second embodiment substantially obtains the same effect.

Embodiment 3

Figure 4:
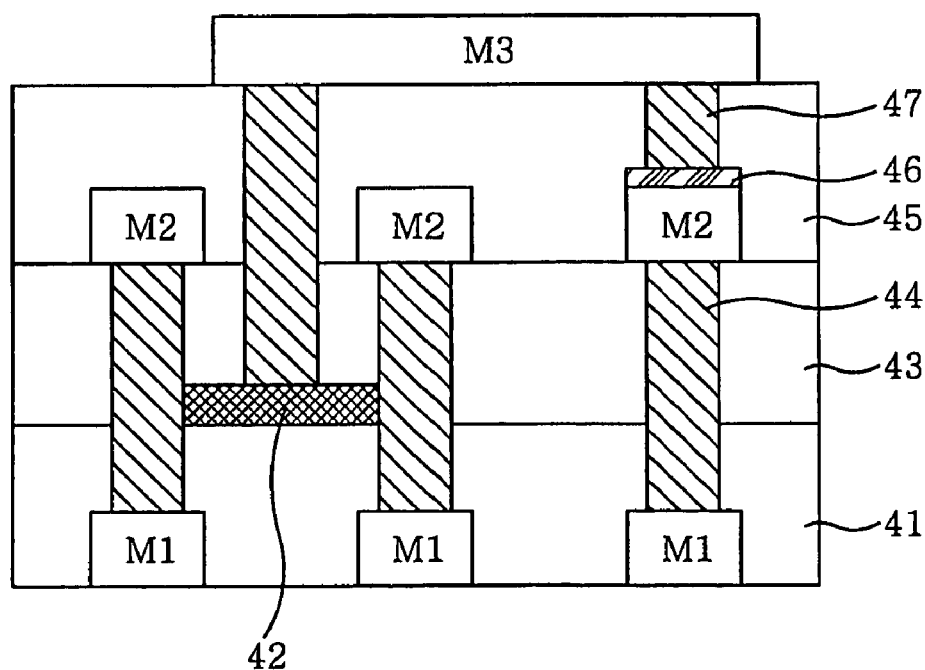
FIG. 4 is a cross-sectional view of a multi layer parallel structured FPGA in accordance with a third embodiment of the present invention.

FIG. 4 is a cross-sectional view of a multi-layer parallel structured FPGA in accordance with a third embodiment of the present invention.

Referring to FIG. 4, a first amorphous silicon pattern 42 is formed at a predetermined region (that is, a region capable of connecting a neighboring pair of a first via through a following process) on a first IMD 41 which buries a first metal wiring M1, and second IMD 43 is formed in a shape of completely burying the first amorphous silicon pattern 42.

Further, a second metal wiring group including a plurality of second metal wiring M2 is formed at a predetermined position on the second IMD 43 (that is, a position corresponding to the first metal wiring), and a second amorphous silicon pattern 46 is formed on an arbitrary second metal wiring M2, which is not paired by the first amorphous silicon pattern 42 through a following process, among the plurality of second metal wiring M2, and a third IMD 45 is formed in a shape of completely burying the second metal wiring M2 group, and a third metal wiring M3 is formed on the third IMD 45.

Meanwhile, each first metal wiring M1 included in the first metal wiring M1 group is connected to each corresponding second metal wiring M2 included in the second metal wiring M2 group through a first via 44, and at least one pair of neighboring firs via 44 is connected each other through the first amorphous silicon pattern 42. Herein, the first amorphous silicon pattern 42 has substantial same function and material with the above-mentioned first amorphous silicon pattern 22a of the first embodiment of the present invention. When a voltage which is equal to or higher than a predetermined voltage level is applied to the first amorphous silicon pattern 42, a character of the first amorphous silicon pattern 42 is changed into a conductive state (that is, voltage selective conductivity) so that a connected conductor is operated as a via or a metal.

Further, the first amorphous silicon pattern 42 and the second amorphous silicon patterns 46 have a structure to be connected to a third metal wiring M3 through a second via 47. Therefore, in the FPGA in accordance with the third embodiment of the present invention, functions of the second and the first metal wirings can be selectively used at the same time with a voltage of the third metal wiring.

That is, in the FPGA in accordance with the third embodiment of the present invention, a pair of the first via which respectively connects a pair of the first metal wirings and a pair of the second metal wirings insulated by the insulating layer IMD are connected each other through the first amorphous silicon pattern, and the second amorphous silicon pattern formed on an upper portion of the unpaired second metal wiring is connected to the third metal wiring through a pair of the second vias. Herein, a thickness of the first amorphous silicon pattern is thicker than that of the second amorphous silicon patter as in the above-mentioned first embodiment of the present invention.

Meanwhile, the FPGA in accordance with the third embodiment of the present invention can be easily embodied by selective combinations of the series of process (for instance, deposition, selective etching and front etching) for manufacturing the FPGA in accordance with the first embodiment of the present invention. Therefore, for avoiding a duplicate description and for a concise description of the specification, a detailed description is omitted.

Accordingly, although the FPGA in accordance with the third embodiment of the present invention has a little bit different structure in comparison with the FPGA in accordance with the first embodiment of the present invention, the FPGA in accordance with the third embodiment substantially has the same effect.

Embodiment 4

Figure 5:
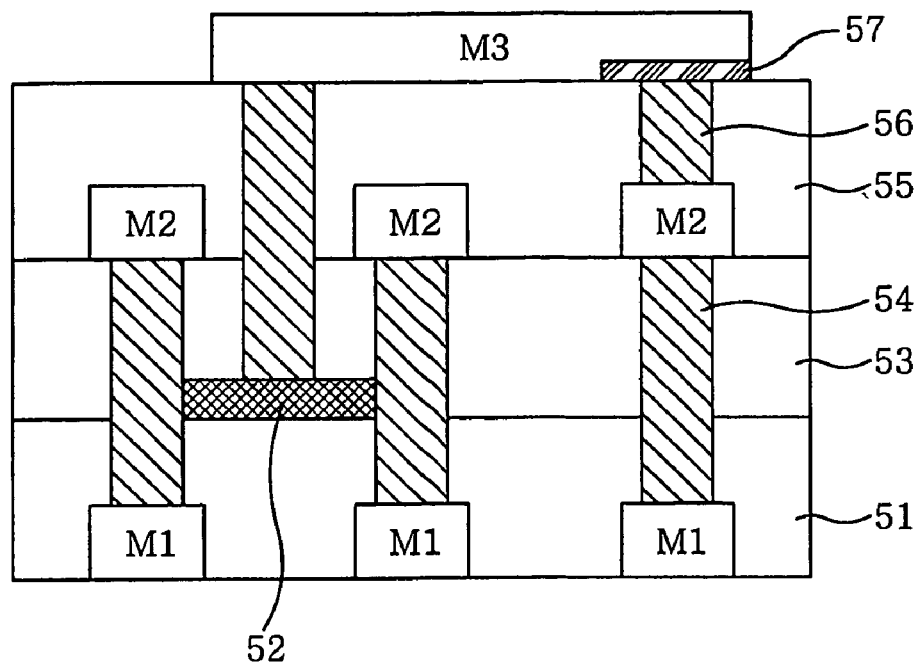
FIG. 5 is a cross-sectional view of a multi layer parallel structured FPGA in accordance with a fourth embodiment of the present invention.

FIG. 5 is a cross-sectional view of a multi-layer parallel structured FPGA in accordance with a fourth embodiment of the present invention.

Referring to FIG. 5, in comparison with the third embodiment of the present invention where the second amorphous silicon pattern 46 is formed on the second metal wiring M2 which is not included in a pair of a first via by the first amorphous silicon pattern M2, a second amorphous silicon pattern 57 is formed on an upper portion of a second via 56 which connects a second metal wiring M2, which is formed on a first via 54 which is not included in a pair of a first via 54 paired by a first amorphous silicon pattern 52, to a third metal wiring M3. That is, the second amorphous silicon pattern 57 is formed between an upper portion of the second via 56 and one side of the third metal wiring M3.

That is, the FPGA in accordance with the fourth embodiment of the present invention has the substantially same structure and/or function except for the forming position of the second amorphous silicon pattern in comparison with the FPGA in accordance with the third embodiment of the present invention. Accordingly, for avoiding a duplicate description and for a concise description of the specification, a detailed description for other components will be omitted. That is, the unexplained referring numbers 51, 53 and 55 respectively indicate a first to a third IMDs.

Therefore, although the FPGA in accordance with the fourth embodiment of the present invention has a little bit different structure in view of the forming position of the second amorphous silicon pattern in comparison with the FPGA in accordance with the third embodiment of the present invention, the FPGA in accordance with the fourth embodiment substantially has the same effect with the FPGA in accordance with the third embodiment of the present invention.

Embodiment 5

Figure 6:
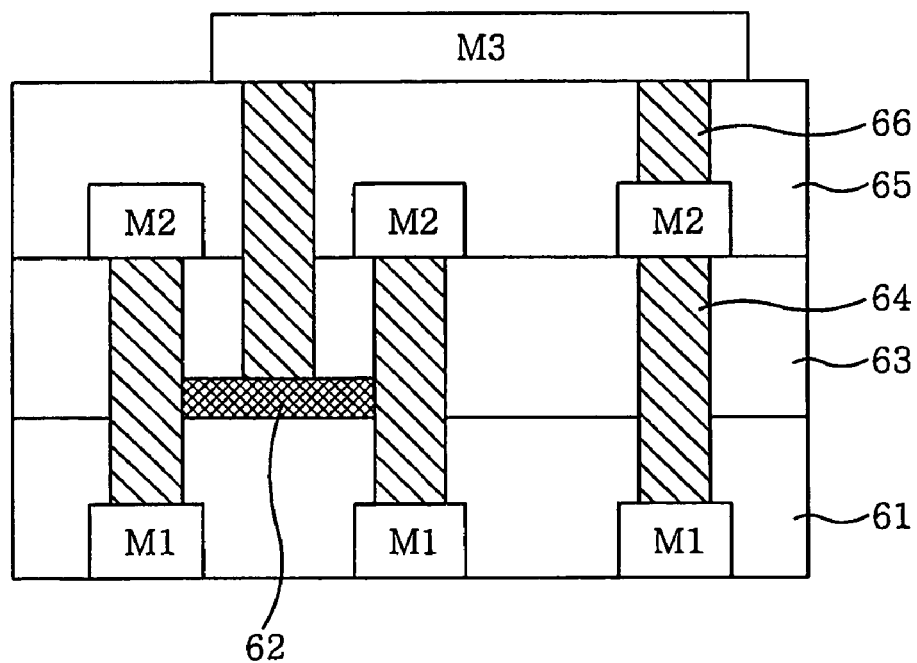
FIG. 6 is a cross-sectional view of a multi layer parallel structured FPGA in accordance with a fifth embodiment of the present invention.

FIG. 6 is a cross-sectional view of a multi-layer parallel structured FPGA in accordance with a fifth embodiment of the present invention.

Referring to FIG. 6, a first amorphous silicon pattern 62 is formed at a predetermined region (that is, a region capable of connecting a neighboring pair of a first via through a following process) on a first IMD 61 which buries a first metal wiring M1, and second IMD 63 is formed in a shape of completely burying the first amorphous silicon pattern 62.

Further, a second metal wiring group including a plurality of second metal wirings M2 is formed at a predetermined position on the second IMD 63 (that is, a position corresponding to the first metal wiring), and a third IMD 65 is formed in a shape of completely burying the second metal wiring M2 group, and a third metal wiring M3 is formed on the third IMD 65.

Meanwhile, each first metal wiring M1 included in the first metal wiring M1 group is connected to each corresponding second metal wiring M2 included in the second metal wiring M2 group through a first via 64, and at least one pair of neighboring first via 64 is connected to each other through the first amorphous silicon pattern 62. Herein, the first amorphous silicon pattern 62 has the substantially same function and material with the above-mentioned first amorphous silicon pattern 22a of the first embodiment of the present invention. When a voltage which is equal to or higher than a predetermined voltage level is supplied to the first amorphous silicon pattern 62, a character of the fist amorphous silicon pattern 62 is changed into a conductive state (that is, voltage selective conductivity) so that a connected conductor is operated as a via or a metal.

Further, the first amorphous silicon pattern 62 and the second metal wiring M2 are connected to a third metal wiring M3 through a second via 66. Therefore, in the FPGA in accordance with the fifth embodiment of the present invention, functions of the second metal wiring and the first metal wiring can be selectively used at the same time by a voltage of the third metal wiring.

That is, in the FPGA in accordance with the fifth embodiment of the present invention, a pair of the first vias which respectively connects a pair of the first metal wirings and a pair of the second metal wirings insulated by the insulating layer IMD is connected to each other through the first amorphous silicon pattern, and the unpaired second metal wiring is connected to the third metal wiring through a pair of the second vias.

Herein, the FPGA in accordance with the fifth embodiment of the present invention can be easily implemented by selective combining the series of processes (for instance, deposition, selective etching and front etching) for manufacturing the FPGA with the FPGA in accordance with the first embodiment of the present invention. Therefore, for avoiding a duplicate description and for a concise description of the specification, a detailed description will be omitted.

Accordingly, although the FPGA in accordance with the fifth embodiment of the present invention has a little bit different structure in comparison with the FPGA in accordance with the first embodiment of the present invention, the FPGA in accordance with the fifth embodiment substantially has the same effect.

The above-described embodiments of the present invention can selectively use the bottom metal wirings by a single voltage by using two amorphous silicon having a different thickness. That is, an effective operation can be realized by a single amorphous silicon pattern during a design work.

Further, since a first via (Via1) connects upper and lower metals before patterning the second metal wiring M2, a manufacturing process is simpler than that of the conventional FPGA and, thus, a manufacturing cost can be decreased.

While the invention has been shown and described with respect to numerous embodiments, it will be understood by those skilled in the art that various changes and modifications may be made without departing from the spirit and scope of the invention as defined in the following claims.

What is claimed is:

1. A field programmable gate array (FPGA) structure of a semiconductor device comprising first and second metal wiring layers stacked one upon another with an inter-metal dielectric layer (IMD) interposed therebetween, the FPGA structure comprising:
   a pair of first vias connecting a pair of first metal wiring portions in the first metal wiring layer to a pair of corresponding second metal wiring portions in the second metal wiring layer, respectively;
   a first pattern having a voltage selectable conductivity and connecting the first vias;
   a second pattern having a voltage selectable conductivity formed on another second metal wiring portion which is not one of the second metal wiring portions corresponding to the first metal wiring portions; and
   a pair of second vias connecting the first and second patterns to respective third metal wiring portions of the third metal wiring layer, respectively,
   wherein a thickness of the first pattern is thicker than that of the second pattern.

2. The FPGA structure of claim 1, wherein the pattern is an amorphous silicon pattern.

3. A field programmable gate array (FPGA) structure of a semiconductor device comprising first and second metal wiring layers stacked one upon another with an inter-metal dielectric layer (IMD) interposed therebetween, the FPGA structure comprising:
   a pair of first vias connecting a pair of first metal wiring portions in the first metal wiring layer to a pair of corresponding second metal wiring portions in the second metal wiring layer, respectively;
   a first pattern having a voltage selectable conductivity and connecting the first vias;
   second vias connecting the first pattern and another second metal wiring portion, which is not one of the second metal wiring portions corresponding to the first metal wiring portions, to respective third metal wiring portions of the third metal wiring layer, respectively; and
   a second pattern having a voltage selectable conductivity formed between (i) an upper portion of the second via connected to said another second metal wiring portion and (ii) the respective third metal wiring portion,
   wherein a thickness of the first pattern is thicker than that of the second pattern.

4. The FPGA structure of claim 3, wherein each of the patterns is an amorphous silicon pattern.

\* \* \* \* \*